United States Patent
Hui et al.

(10) Patent No.: US 10,587,290 B2
(45) Date of Patent: Mar. 10, 2020

(54) CIRCULAR BUFFER RATE MATCHING FOR POLAR CODES

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/246,319

(22) Filed: Jan. 11, 2019

(65) Prior Publication Data

US 2019/0149176 A1    May 16, 2019

Related U.S. Application Data

(63) Continuation of application No. PCT/IB2018/050813, filed on Feb. 9, 2018.

(Continued)

(51) Int. Cl.
*H03M 13/00* (2006.01)
*H03M 13/13* (2006.01)
*H04L 1/00* (2006.01)

(52) U.S. Cl.
CPC ....... *H03M 13/6362* (2013.01); *H03M 13/13* (2013.01); *H03M 13/6306* (2013.01);
(Continued)

(58) Field of Classification Search
CPC combination set(s) only.
See application file for complete search history.

(56) References Cited

U.S. PATENT DOCUMENTS 8,254,303 B2 * 8/2012 Becker ............... H04B 7/18582
370/315
8,520,496 B2 * 8/2013 Nimbalker ............ H04L 1/0069
370/206

(Continued)

FOREIGN PATENT DOCUMENTS

CA    2968892 A1    6/2016
EP    3113387 A1    1/2017

(Continued)

OTHER PUBLICATIONS

Arikan, Erdal, "Channel Polarization: A Method for Constructing Capacity-Achieving Codes for Symmetric Binary-Input Memoryless Channels," IEEE Transactions on Information Theory, vol. 55, No. 7, Jul. 2009, pp. 3051-3073.

(Continued)

*Primary Examiner* — Esaw T Abraham
(74) *Attorney, Agent, or Firm* — Withrow & Terranova, PLLC

(57) ABSTRACT

Methods are proposed herein to perform rate matching for polar codes via circular buffering of the polar encoded bits. Embodiments are directed to methods of operation of a transmitting node in a wireless system including performing polar encoding of a set of information bits in accordance with a polar sequence of length $N_B$ to thereby generate $N_B$ coded bits. The method can further include interleaving the coded bits to thereby provide an interleaved coded bit sequence, and storing the interleaved coded bit sequence into a circular buffer of length $N_B$. According to certain embodiments, the method can further include extracting N coded bits for transmission from the circular buffer. N can be greater than, equal to, or less than $N_B$.

17 Claims, 12 Drawing Sheets

Block diagram of rate matching mechanism with circular buffer for polar codes

Related U.S. Application Data

(60) Provisional application No. 62/457,665, filed on Feb. 10, 2017.

(52) U.S. Cl.
CPC ...... *H03M 13/6356* (2013.01); *H04L 1/0013* (2013.01); *H04L 1/0057* (2013.01); *H04L 1/0071* (2013.01)

(56) References Cited

U.S. PATENT DOCUMENTS

| | | | | |
|---|---|---|---|---|
| 10,135,571 | B2* | 11/2018 | Shen | ............... H04L 1/0057 |
| 10,361,815 | B2* | 7/2019 | Shen | ............... H03M 13/13 |
| 10,362,565 | B2* | 7/2019 | You | ............... H04L 1/0067 |
| 2003/0167436 | A1* | 9/2003 | Ha | ............... H03M 13/271 |
| | | | | 714/756 |
| 2006/0156199 | A1* | 7/2006 | Palanki | ............ H03M 13/2757 |
| | | | | 714/776 |
| 2007/0189151 | A1* | 8/2007 | Pan | ............... H04L 1/0009 |
| | | | | 370/210 |
| 2008/0307293 | A1* | 12/2008 | Cheng | ............... H03M 13/23 |
| | | | | 714/790 |
| 2014/0192847 | A1* | 7/2014 | Afkhami | ............ H04L 27/2649 |
| | | | | 375/219 |
| 2015/0295593 | A1 | 10/2015 | Trifonov et al. | |
| 2016/0182187 | A1 | 6/2016 | Kim et al. | |
| 2016/0352464 | A1* | 12/2016 | Shen | ............... H03M 13/13 |
| 2017/0012739 | A1 | 1/2017 | Shen et al. | |

FOREIGN PATENT DOCUMENTS

| | | |
|---|---|---|
| EP | 3113398 A1 | 1/2017 |
| WO | 2018146629 A1 | 2/2018 |

OTHER PUBLICATIONS

Douillard, Catherine, et al., "The Bit Interleaved Coded Modulation Module for DVB-NGH," 19th International Conference on Telecommunications (ICT), Jounieh, 2012, pp. 1-6.

Leroux, Camille, et al., "A Semi-Parallel Successive-Cancellation Decoder for Polar Codes," IEEE Transactions on Signal Processing, vol. 61, No. 2, Jan. 15, 2013, 10 pages.

Tal, Ido, et al., "List Decoding of Polar Codes," IEEE Transactions on Information Theory, vol. 61, No. 5, May 2015, 11 pages.

ZTE, et al., "R1-1701602: Rate Matching of Polar Codes for eMBB," Third Generation Partnership Project (3GPP), TSG RAN WG1 Meeting #88, Feb. 13-17, 2017, 20 pages, Athens, Greece.

International Search Report and Written Opinion for International Patent Application No. PCT/IB2018/050813, dated May 17, 2018, 10 pages.

Official Action for Russian Patent Application No. 2019105300, dated Nov. 6, 2019, 15 pages.

* cited by examiner

Example of polar code structure with N = 8

*Polar code encoder with N = 8*

Block diagram of rate matching mechanism with circular buffer for polar codes

*Illustration of resource assignment for downlink control information in PDCCH*

*Illustration of resource assignment for downlink control information in PDCCH and PDSCH*

Illustration of resource assignment for downlink control information in PUCCH

Illustration of resource assignment for downlink control information in PSCCH

Block diagram of rate matching mechanism with circular buffer and modulation for polar codes

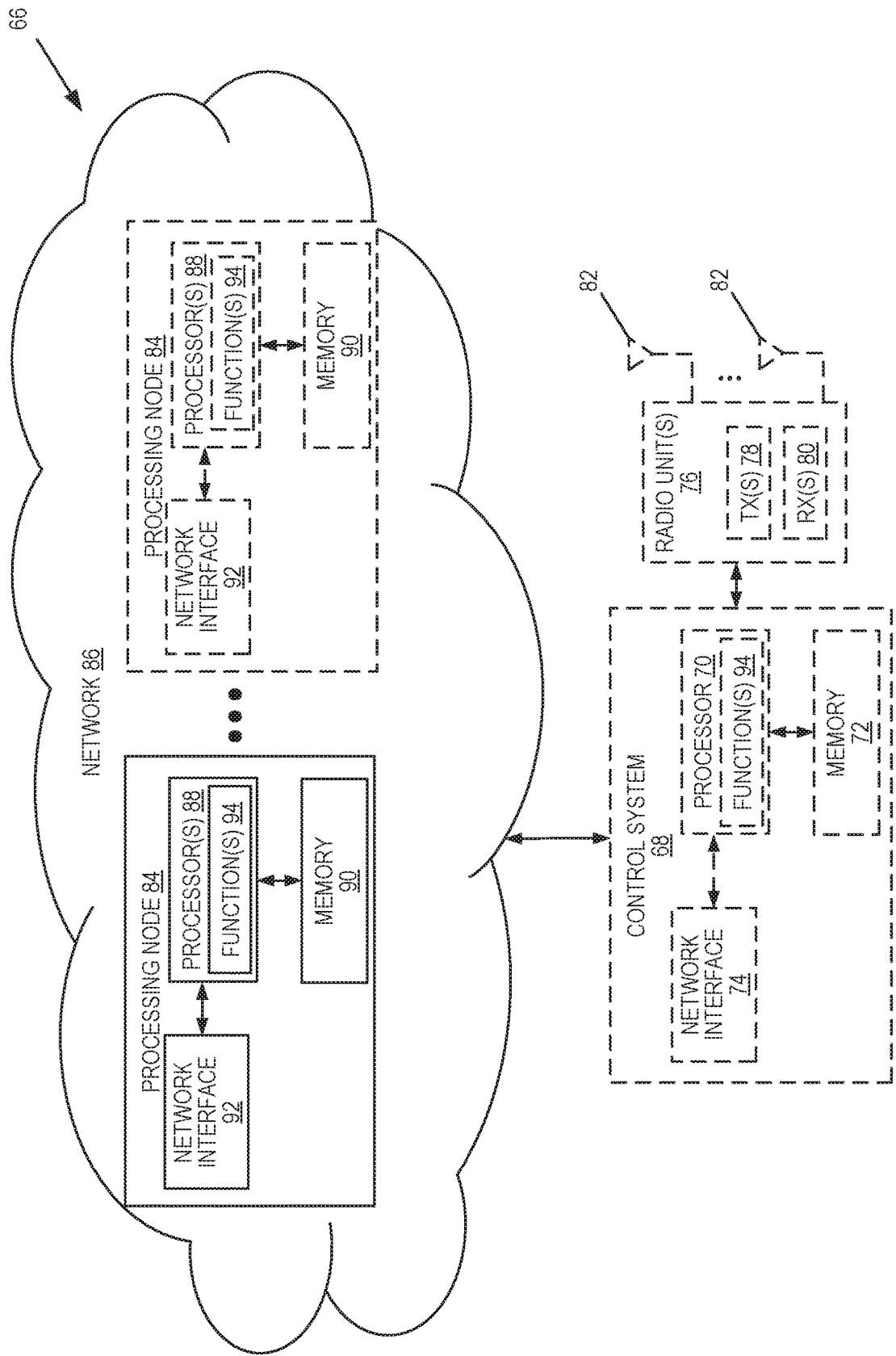

CIRCULAR BUFFER RATE MATCHING FOR POLAR CODES

CROSS-REFERENCE TO RELATED APPLICATIONS

The present application is a continuation of International Application No. PCT/IB2018/050813, filed Feb. 9, 2018, which claims priority to Provisional Application No. 62/457,665 filed Feb. 10, 2017, the disclosures of which are incorporated herein by reference in their entireties.

TECHNICAL FIELD

The present disclosure rate to polar codes and, in particular, rate-matching for polar codes.

BACKGROUND

Polar codes, proposed by Arikan [1], are the first class of constructive coding schemes that are provable to achieve the symmetric capacity of the binary-input discrete memoryless channels under a low-complexity Successive Cancellation (SC) decoder. However, the finite-length performance of polar codes under SC is not competitive compared to other modern channel coding schemes such as Low-Density Parity-Check (LDPC) codes and turbo codes. Later, SC List (SCL) decoder is proposed in [2], which can approach the performance of optimal Maximum-Likelihood (ML) decoder. By concatenating a simple Cyclic Redundancy Check (CRC) coding, it was shown that the performance of concatenated polar code is competitive with that of well-optimized LDPC and turbo codes. As a result, polar codes are being considered as a candidate for future Fifth Generation (5G) wireless communication systems.

The main idea of polar coding is to transform a pair of identical binary-input channels into two distinct channels of different qualities, one better and one worse than the original binary-input channel. By repeating such a pair-wise polarizing operation on a set of $2^M$ independent uses of a binary-input channel, a set of $2^M$ "bit-channels" of varying qualities can be obtained. Some of these bit channels are nearly perfect (i.e., error free) while the rest of them are nearly useless (i.e., totally noisy). The point is to use the nearly perfect channel to transmit data to the receiver while setting the input to the useless channels to have fixed or frozen values (e.g., 0) known to the receiver. For this reason, those input bits to the nearly useless and the nearly perfect channel are commonly referred to as frozen bits and non-frozen (or information) bits, respectively. Only the non-frozen bits are used to carry data in a polar code. Loading the data into the proper information bit locations has direct impact on the performance of a polar code. An illustration of the structure of a length 8 polar code is illustrated in FIG. 1.

FIG. 2 illustrates the labeling of the intermediate information bits $s_{l,i}$, where $l \in \{0, 1, \ldots, n\}$ and $i \in \{0, 1, \ldots, N-1\}$ during polar encoding with N=8. The intermediate information bits are related by the following equation:

$$s_{l+1,i} = s_{l,i} \oplus s_{l,i+2^l}, \text{ if } \mathrm{mod}\left(\left\lfloor \frac{i}{2^l} \right\rfloor, 2\right) = 0,$$

$$s_{l+1,i} = s_{l,i}, \text{ if } \mathrm{mod}\left(\left\lfloor \frac{i}{2^l} \right\rfloor, 2\right) = 1$$

for $i \in \{0, 1, \ldots, N-1\}$ and $l \in \{0, 1, \ldots, n-1\}$, with $s_{0,i}=u_i$ as the info bits, and $s_{n,i}=x_i$ as the code bits, for $i \in \{0, 1, \ldots, N-1\}$.

SUMMARY

Problems with Existing Solutions

A major limitation of conventional polar codes is that the codeword length or code length must be a power of two. Puncturing of coded bits (i.e., dropping some coded bits without transmitting them) is a natural method to support the granularity in codeword length required in practice. Also, when the desired codeword length is only slightly over a power of two, it is more practical to just repeat some of the coded bits instead of demanding the receiver to operate at twice the codeword length, which in turn increases the latency and power consumption and imposes a more stringent hardware requirement on processing speed and memory. Such a process of generating codewords with any desired length (typically through puncturing or repetition) is referred to as a rate-matching process. It is unclear how puncturing and repetition of polar encoded bits should be performed in an efficient manner while maintaining a close-to-optimum performance.

Brief Summary of Some Embodiments of the Present Disclosure/Solution

Methods are proposed herein to perform rate matching for polar codes via circular buffering of the polar encoded bits. Embodiments disclosed herein are directed to a method of operation of a transmitting node in a wireless system including performing polar encoding of a set of information bits in accordance with a polar sequence of length $N_B$ to thereby generate $N_B$ coded bits. The method can further include interleaving the coded bits to thereby provide an interleaved coded bit sequence; and storing the interleaved coded bit sequence into a circular buffer of length $N_B$. According to certain embodiments, the method can further include extracting N coded bits for transmission from the circular buffer. N can be greater than, equal to, or less than $N_B$.

Another embodiment of the present disclosure is directed to a transmitting node configured to perform polar encoding of a set of information bits in accordance with a polar sequence of length $N_B$ to thereby generate $N_B$ coded bits. The transmitting node can be configured to interleave the coded bits to thereby provide an interleaved coded bit sequence; and store the interleaved coded bit sequence into a circular buffer of length $N_B$. According to certain embodiments, the transmitting node can extract N coded bits for transmission from the circular buffer. N can be greater than, equal to, or less than $N_B$. According to various embodiments, the transmitting node may be a user equipment or any network node.

Yet another embodiment is directed to a transitory or non-transitory computer-readable medium storing instruction thereon for, when executed by one or more processors, perform a method including performing polar encoding of a set of information bits in accordance with a polar sequence of length $N_B$ to thereby generate $N_B$ coded bits. The method can further include interleaving the coded bits to thereby provide an interleaved coded bit sequence; and storing the interleaved coded bit sequence into a circular buffer of length $N_B$. According to certain embodiments, the method can further include extracting N coded bits for transmission from the circular buffer. N can be greater than, equal to, or less than $N_B$.

Various other features and advantages will become apparent to those of ordinary skill in the art, in light of the following written description and accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

FIGS. 13, 14 and 15 illustrate example embodiments of a network node in which embodiments of the present disclosure may be implemented, according to various embodiments.

DETAILED DESCRIPTION

Figure 1:
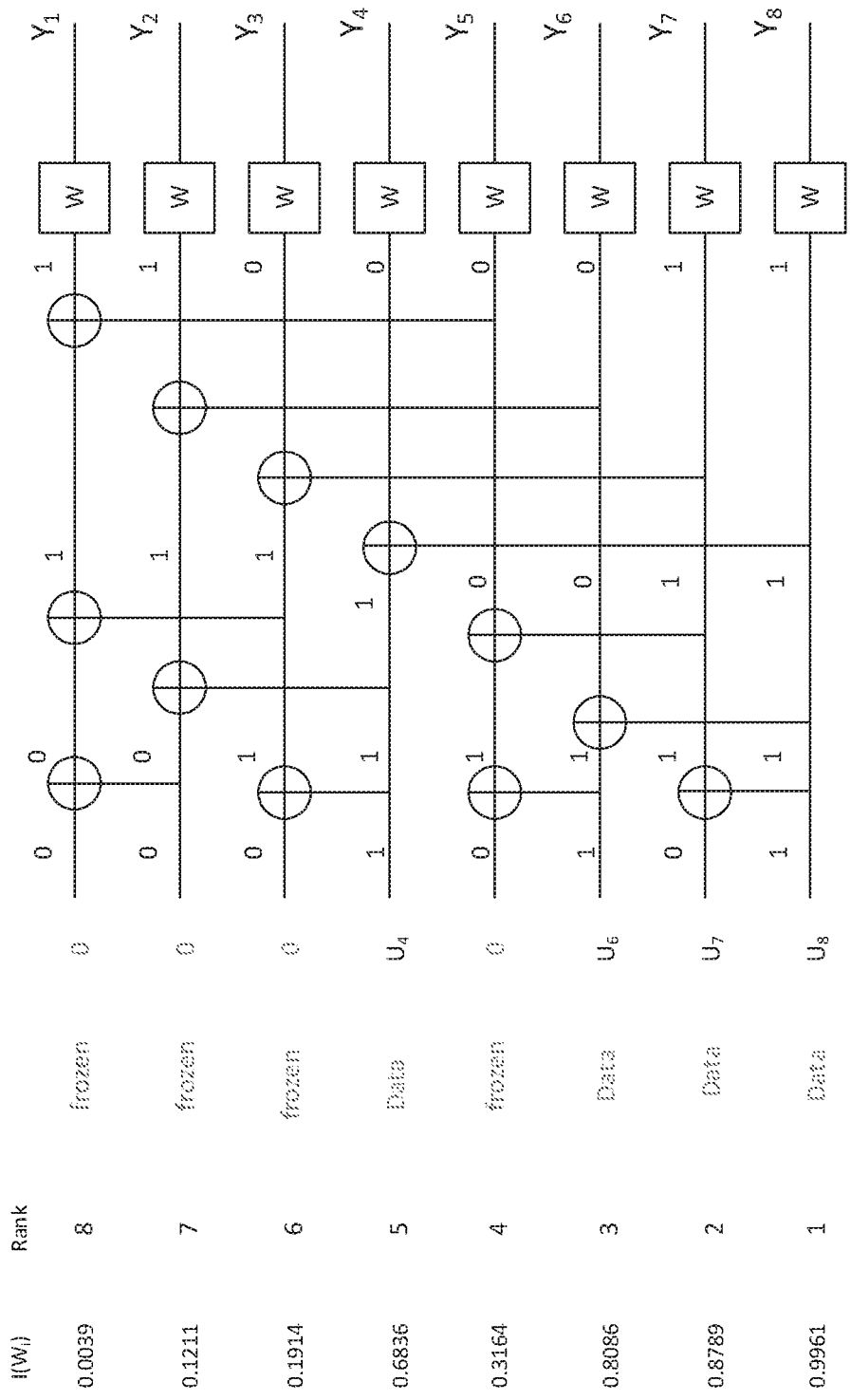
FIG. 1 is an illustration of the structure of a length 8 polar code.
Figure 2:
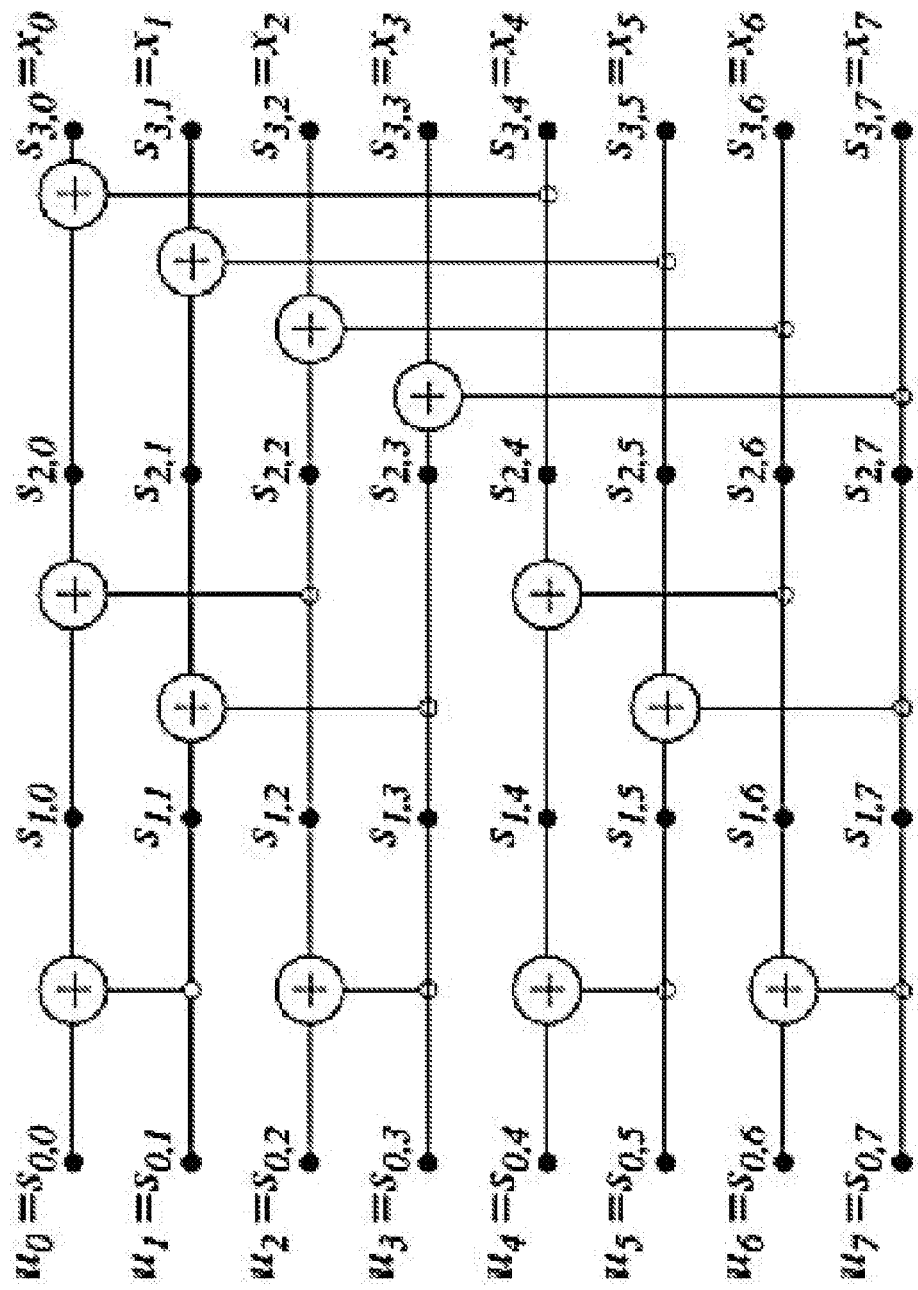
FIG. 2 illustrates the labeling of the intermediate information bits $s_{l,i}$, where $l \in \{0, 1, \ldots, n\}$ and $i \in \{0, 1, \ldots, N-1\}$ during polar encoding with N=8.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node:

As used herein, a "radio node" is either a radio access node or a wireless device.

Radio Access Node:

As used herein, a "radio access node" or "radio network node" is any node in a radio access network of a cellular communications network that operates to wirelessly transmit and/or receive signals. Some examples of a radio access node include, but are not limited to, a base station (e.g., a New Radio (NR) base station (gNB) in a Third Generation Partnership Project (3GPP) Fifth Generation (5G) NR network or an enhanced or evolved Node B (eNB) in a 3GPP Long Term Evolution (LTE) network), a high-power or macro base station, a low-power base station (e.g., a micro base station, a pico base station, a home eNB, or the like), and a relay node.

Core Network Node:

As used herein, a "core network node" is any type of node in a core network. Some examples of a core network node include, e.g., a Mobility Management Entity (MME), a Packet Data Network Gateway (P-GW), a Service Capability Exposure Function (SCEF), or the like.

Wireless Device:

As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node:

As used herein, a "network node" is any node that is either part of the radio access network or the core network of a cellular communications network/system.

Note that the description given herein focuses on a 3GPP cellular communications system and, as such, 3GPP terminology or terminology similar to 3GPP terminology is oftentimes used. However, the concepts disclosed herein are not limited to a 3GPP system.

Note that, in the description herein, reference may be made to the term "cell;" however, particularly with respect to 5G NR concepts, beams may be used instead of cells and, as such, it is important to note that the concepts described herein are equally applicable to both cells and beams.

A major limitation of conventional polar codes is that the codeword length or code length must be a power of two. Puncturing of coded bits (i.e., dropping some coded bits without transmitting them) is a natural method to support the granularity in codeword length required in practice. Also, when the desired codeword length is only slightly over a power of two, it is more practical to just repeat some of the coded bits instead of demanding the receiver to operate at twice the codeword length, which in turn increases the latency and power consumption and imposes a more stringent hardware requirement on processing speed and memory. Such a process of generating codewords with any desired length (typically through puncturing or repetition) is referred to as a rate-matching process. It is unclear how puncturing and repetition of polar encoded bits should be performed in an efficient manner while maintaining a close-to-optimum performance.

Methods are proposed here to perform rate matching for polar codes via circular buffering of the polar encoded bits. The key part of the present disclosure is that the interleaver that specifies how the polar encoded bits are written into the circular buffer and the bit-extractor that specifies how bits are extracted from the circular buffers are dependent on link parameters, such as code block length, coding rate, and (Quadrature Amplitude Modulation (QAM)) modulation order, and/or system parameters, such as the transmission methods (Orthogonal Frequency Division Multiplexing (OFDM) vs. Discrete Fourier Transform Spread OFDM (DFT-S-OFDM)), radio resource allocation and receiver capability. According to a preferred embodiment, based on these various parameters, a sequence that ranks the reliability of the polar coded bits is constructed, based on which the interleaver determines the ordering with which the polar coded bits are written into the circular buffers. This code-bit ranking sequence which in turn determines an info-bit ranking sequence which is used to determine the information set of the polar encoder. Both of these sequences can be predetermined and stored in memory for different values of the aforementioned parameters.

A key advantage of the proposed method is that it can optimizes the code performance for different scenarios since the puncturing, repetition, and information set selection for polar codes are often dependent on various link and system parameters. Another key advantage of the proposed method is that it is simple to implement and is flexible enough for future evolution of polar coding. The proposed scheme can also be viewed as an extension and generalization to the existing rate-matching scheme used by LTE.

The core essence of the solution is a rate matching mechanism that is dependent on several link parameters (such as code block length, coding rate, and (QAM) modulation order) and or system parameters (such as OFDM vs. DFT-S-OFDM), radio resource allocation and receiver capability).

Rate Matching Structure Without Modulation

Figure 3:
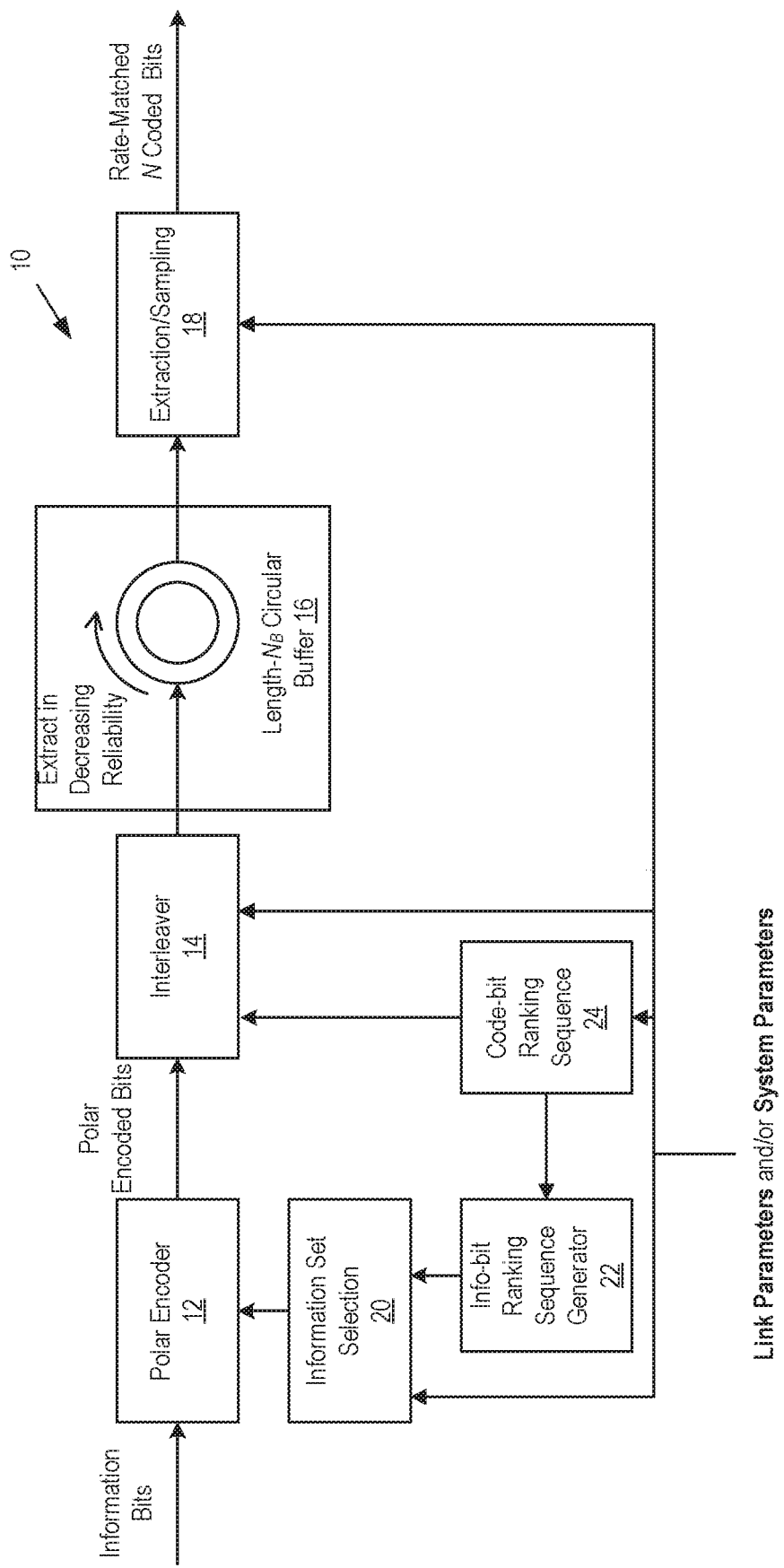
FIG. 3 a polar encoder and rate matching system with a circular buffer for polar codes according to some embodiments of the present disclosure.
Figure 4:
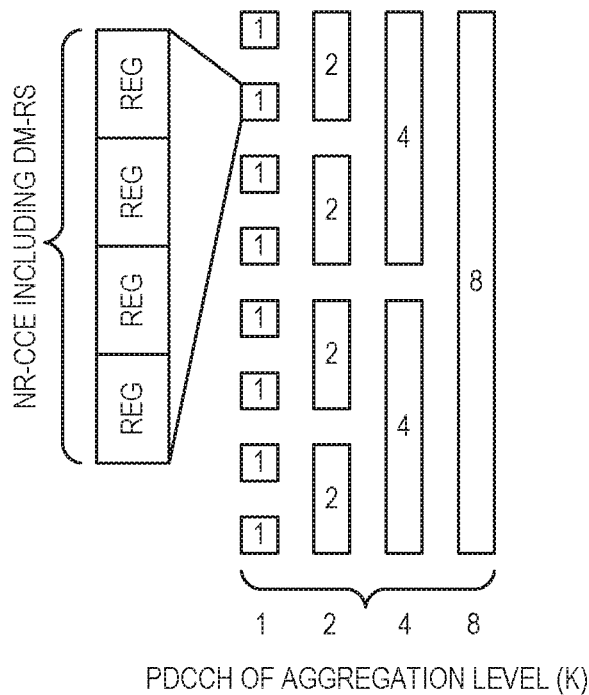
FIG. 4 illustrates resource assignment for Downlink Control Information (DCI) in a Physical Downlink Control Channel (PDCCH), according to various embodiments.
Figure 5:
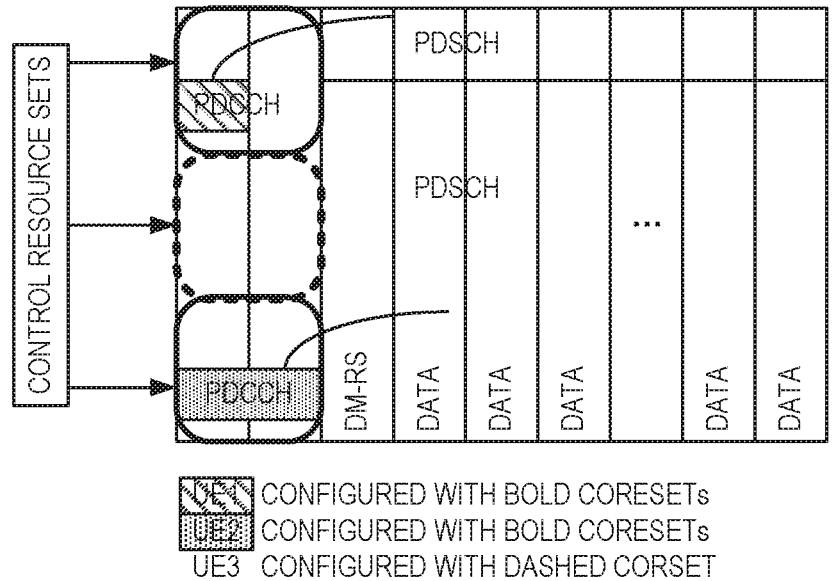
FIG. 5 illustrates resource assignment for DCI in PDCCH and a Physical Downlink Shared Channel (PDSCH), according to various embodiments.
Figure 6:
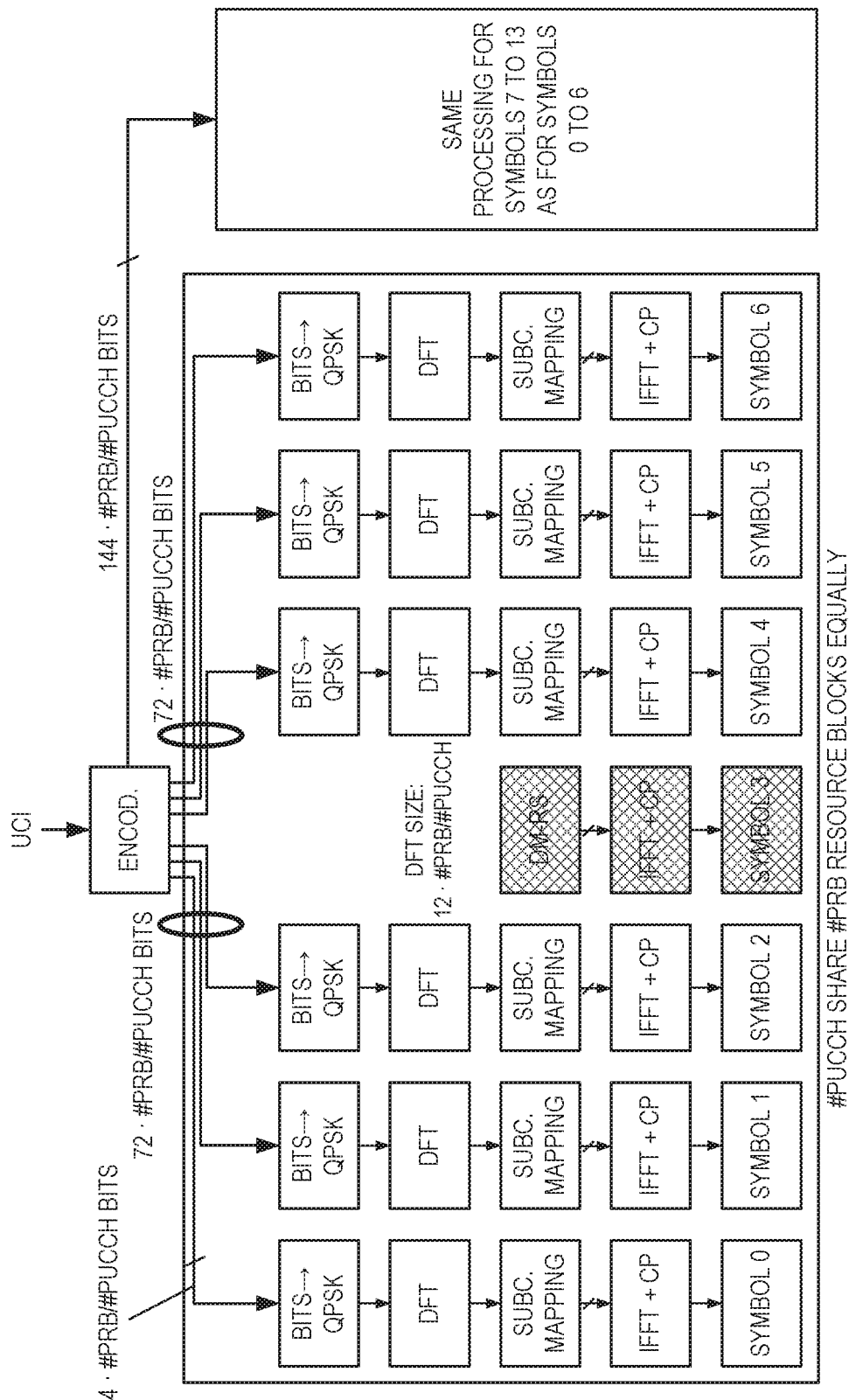
FIG. 6 illustrates resource assignment for Uplink Control Information (UCI) in a Physical Uplink Control Channel (PUCCH), according to various embodiments.
Figure 7:
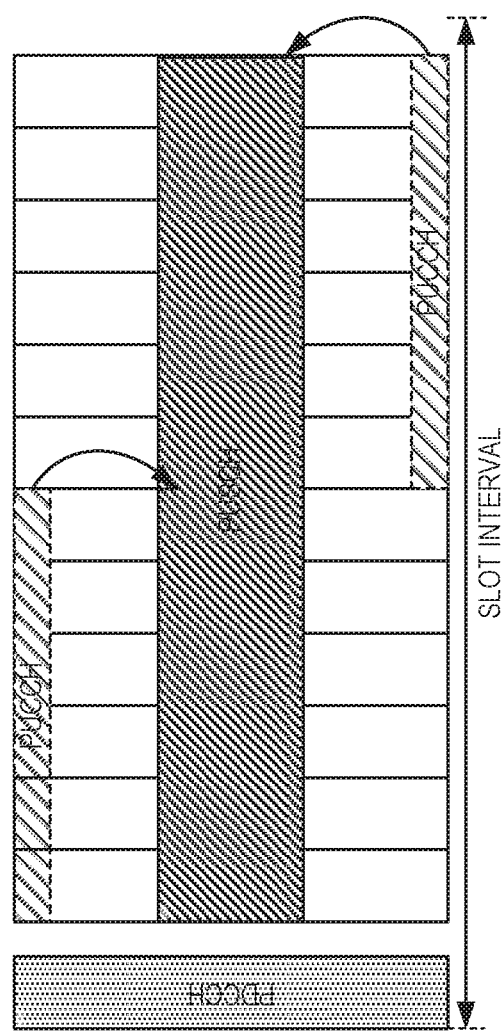
FIG. 7 illustrates resource assignment for DCI in Physical Sidelink Control Channel (PSCCH), according to various embodiments.

FIG. 3 shows system 10 that provides rate matching with a circular buffer for polar codes according to some embodiments of the present disclosure. As illustrated, the system 10 includes a polar encoder 12 and a rate matching system, or mechanism. The rate matching system includes, in this example, an interleaver 14, a circular buffer 16, and an extraction/sampling function 18 (also referred to herein as a bit-extractor 18). The rate matching system further includes, in this example, an information set selection function 20 (also referred to herein as an information set selector 20), an information bit ranking sequence generator 22, and code-bit ranking sequence generator 24. Note that the various components of the system 10 illustrated in FIG. 3 are implemented in hardware or a combination of hardware and software, as will be appreciated by and readily apparent to one of ordinary skill in the art upon reading this disclosure. As discussed below, the rate matching system provides rate matching for a set of polar encoded bits output by the polar encoder 12. In other words, the rate-matching system generates or outputs a desired number N of coded bits based on $N_B$ coded bits output by the polar encoder, where $N_B$ is the length of the mother code of the polar encoder 12 and the desired number N of coded bits can be less than or greater than $N_B$.

The polar encoder 12 of a mother code block length $N_B$ generates a block of $N_B$ coded bits based on the information bits and a set of information bit locations specified by the information set selector 20. These $N_B$ coded bits are written into the circular buffer 16 after being permuted by the interleaver 14. The bit-extractor 18 is used to extract bits from the circular buffer 16 (e.g., in a periodic manner) until the desired number N of coded bits are extracted for transmission. When N>$N_B$, some bits may be extracted more than once from the circular buffer 16 to achieve repetition.

The key components are the interleaver 14 that permutes the coded bits output of a polar encoder 12 before placing the permuted, or re-ordered, coded bits into the circular buffer 16 and the bit-extractor 18 that extract bits out of the circular buffer 16 for transmission. Note that in this description, "re-order," "permute," and "interleave" terminologies are used interchangeably. Unlike those interleavers designed for other codes, such as turbo codes used in LTE, the interleaver 14 and/or the bit-extractor 18 proposed herein are adaptive in a sense that they can depend on various link parameters and/or various system parameters. Since the choice of information set is also closely linked to the choice of the interleaver 14, the information selector 20 for the polar encoder 12 also in turn depends on these various parameters.

The link parameters may include the following:
Number of information bits K
Code length N, and/or
Code rate R=K/N,
while the system parameter may include the following:
Uplink vs Downlink
  The channel conditions and interference environment for uplink and downlink can be quite different, which can have an impact on the choice of the interleaver, information set selector, and the bit-extractor.
Radio Resource Allocation
  Polar code has been adopted in 5G NR for transmitting control information. Control information may be carried by dedicated control channels, such as Physical Downlink Control Channel (PDCCH) or Physical Uplink Control Channel (PUCCH) in LTE, or embedded in data channels such as Physical Uplink Shared Channel (PUSCH) in LTE. Since radio resources are often allocated differently for these channels (e.g. PDCCH is predominated frequency spread and short in time, while PDSCH is often spread in both time and frequency) as illustrated in FIG. 4 through 7, the channel conditions are different which can affect the desired operations of the interleaver 14, bit extractor 18, and information set selector 20.
Waveform: OFDM vs DFT-S-OFDM.
  For Downlink Control Information (DCI), OFDM is used. DCI is carried by PDCCH. For Uplink Control Information (UCI), both OFDM and DFT-S-OFDM can be used. Which waveform to use is up to higher layer signaling. Furthermore, UCI can be carried by PUCCH and PUSCH.
  OFDM and DFT-S-OFDM exhibit different channel quality property to the polar decoder. For OFDM, the modulation symbols may experience fading channel condition, and the channel Log-Likelihood Ratio (LLR) for the modulation symbols can vary widely. For DFT-S-OFDM, in contrast, the modulation symbols carried by the same DFT-S-OFDM symbol experience the same channel condition (possibly dispersive channel), although the channel condition may vary from one DFT-S-OFDM symbol to another DFT-S-OFDM symbol depending on Doppler.
  To adapt to the waveform, the rate matching algorithm for polar codes should be customized accordingly.
Redundancy versions
  In some communication scenarios, a single transmission is not enough to provide sufficient single reliability or signal coverage to the serviced area. Oftentimes, multiple transmissions of the same block of information bits are needed, for example, in broadcast channels (such as Physical Broadcasting Channel (PBCH)), system information channels (e.g., System Information Block (SIB), Hybrid Automatic Repeat Request (HARQ) retransmission protocol. In this case, it is preferred to send a differently coded version of the same information in different transmissions. The rate-matching mechanism (e.g., the interleaver 14, information bit selector 20, and bit-extractor 18) can be different for these different redundancy versions.

Receiver capability

Depending on the receiver capability, the rate matching mechanism (e.g., interleaver 14, bit-extractor 18, and the information bit selector 20) may be different. Here, the receiver mainly refers to the UE receiver on the downlink.

If polar codes are used to carry data packets, the soft buffer size to store the channel bits may vary significantly between cheaper/lower-complexity, UEs, and more expensive/higher-complexity UEs.

It is noted that this issue typically does not apply to control information reception, which is carried by PDCCH. Typically it is applicable for receiving data payload, which is carried by Physical Downlink Shared Channel (PDSCH).

Hence depending on the receiver soft buffer size, the rate matching algorithm should:
a) Use a polar code with code length determined only by available amount of radio resource element if UE receiver is equipped with a large buffer of soft bits.
b) If the UE receiver is equipped with a smaller soft buffer and/or a cheaper decoder, a polar code with a limited code length determined by the available buffer size is used. If more time-frequency resource is supplied than the available coded bits than due to the limited code length, repetition of some of the coded bits can be used to fill the resource. All soft bits from a repeated code bit can simply be added in place together in the same memory unit so that the soft buffer requirement is dictated only by the limited code length.

Note that the above consideration applies to both a single transmission, as well as multiple transmissions of a given packet when Incremental Redundancy HARQ (IR-HARQ) retransmission methods are used.

According to some preferred embodiments, in order to assist the formation of the permutation of polar coded bits used by the interleaver 14, a sequence of rankings on the coded bits, which specifies an order by which coded bits are loaded into the circular buffer 16 such that the more reliable coded bits are placed onto the circular buffer 16 first until the least reliable bit is placed, is generated based on these link and/or system parameters described above. According to the desired block length the coded bits in the circular buffer 16 are then extracted from the circular buffer 16 in the order of decreasing reliability starting from the most reliable code bit.

According to some preferred embodiments, the code-bit ranking sequence $\rho_c$: $\{1, 2, \ldots, N_B\} \rightarrow \{1, 2, \ldots, N_B\}$ is a function of the binary representation of the indices of the coded bits. Two examples of $\rho_c(n)$ are described below:

$\rho_c(n)$ can represent a permutation of the bits in the binary representation of the indices of the coded bits. One example of the permutation is the bit-reversal operation on the indices of the coded bits.

$\rho_c(n)$ can be a weighted function between the indices of the coded bits and the Hamming weight of the binary representation of the indices of the coded bits.

The code-bit ranking sequence $\rho_c(n)$ may further be used to generate a corresponding info-bit ranking sequence $\rho_i$: $\{1, 2, \ldots, N_B\} \rightarrow \{1, 2, \ldots, N_B\}$, which is used to determine the information set (i.e. the location of the bit-channel that carries data) used for polar encoder. The info-bit ranking sequence $\rho_i(n)$ may be computed by setting it to be the same as $\rho_c(n)$ (i.e. $p_i(n)=p_c(n)$); or evaluating sequentially some function of the binary representation of each code bit index in the order specified by the code-bit ranking sequence $\rho_c(n)$, and generating $\rho_i(n)$ according to the resulting function values.

lowering the ranks (i.e. lowering reliability measures) of some of the info-bit based on the number of punctured code bits, e.g. ($\lceil \log_2 N \rceil - N$).

According to some embodiments, if a block length N that is shorter than half of the mother code block length $N_B$ used in the polar encoder, the code bits are extracted from the circular buffer 16 based on subsampling of the content in the circular buffer 16, in a decreasing reliability manner. For example, if $N_B=2N$, then the bit-extractor 18 may take every other sample (i.e., 2× subsampling) from the circular buffer 16 until N coded bits are extracted.

Rate Matching Structure With Modification

Figure 8:
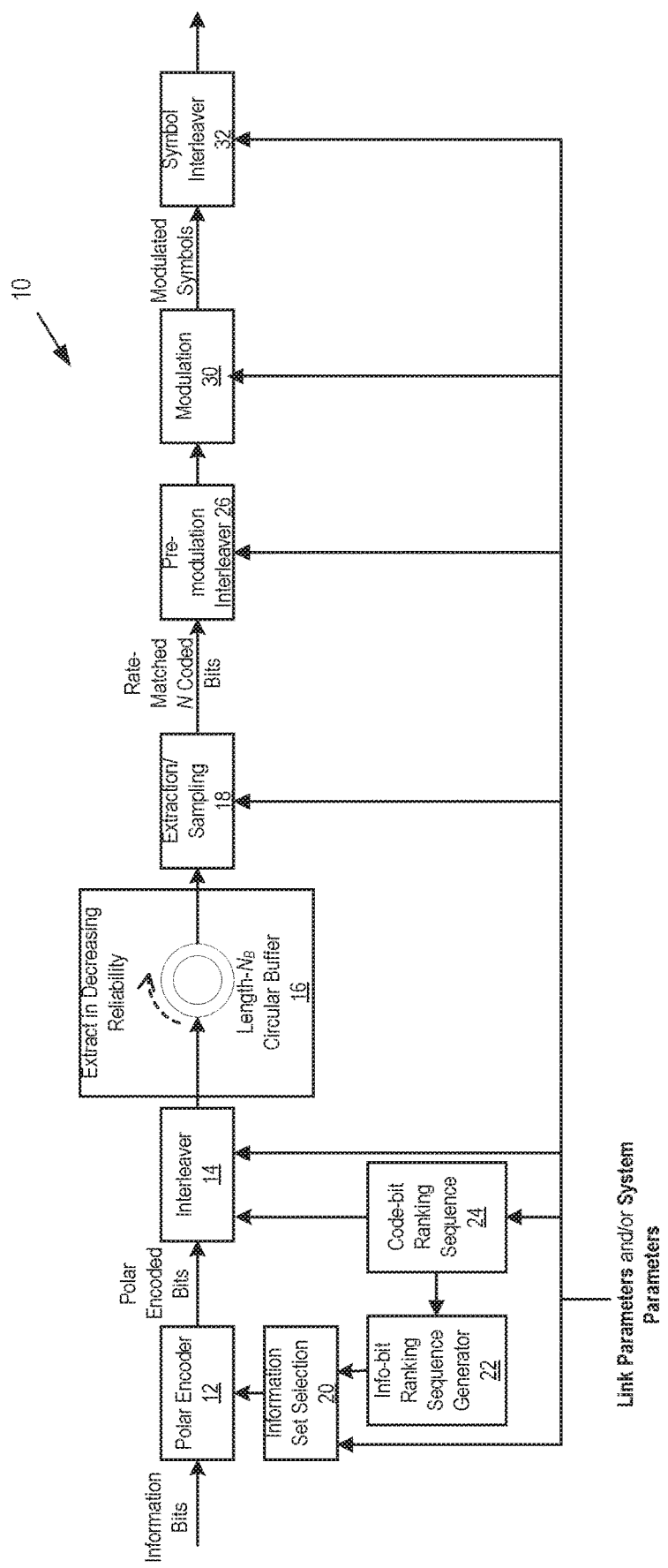
FIG. 8 illustrates a polar encoder and rate matching system with a circular buffer and modulation for polar codes according to some embodiments of the present disclosure, according to various embodiments.

FIG. 8 shows a block diagram of the system 10 according to some other embodiments in which the system 10 provides rate matching for polar codes together with complex-valued symbol modulation. In this case, the link parameters further include the modulation order (i.e. number of coded bits in one complex-valued symbol).

Two additional interleavers 26 and 28 are added, one before and one after a modulator 30. The pre-modulation interleaver 26 re-orders the coded bits extracted from the circular buffer 16 before mounting them into symbols. The pre-modulation interleaver 26 is designed to map the coded bits with different reliabilities into those bits with different Subscribe-Notifications-Request (SNR) within each symbol, since some of the bits in each symbol experience higher SNR than others in the same symbol. This can for example be implemented using a rectangular interleaver.

The symbol interleaver 28 after the modulation is performed before loading the symbols into the assigned radio resources (or subcarriers in OFDM) so that, for example, symbols of different reliability can match the channel quality of different radio resources.

Figure 9:
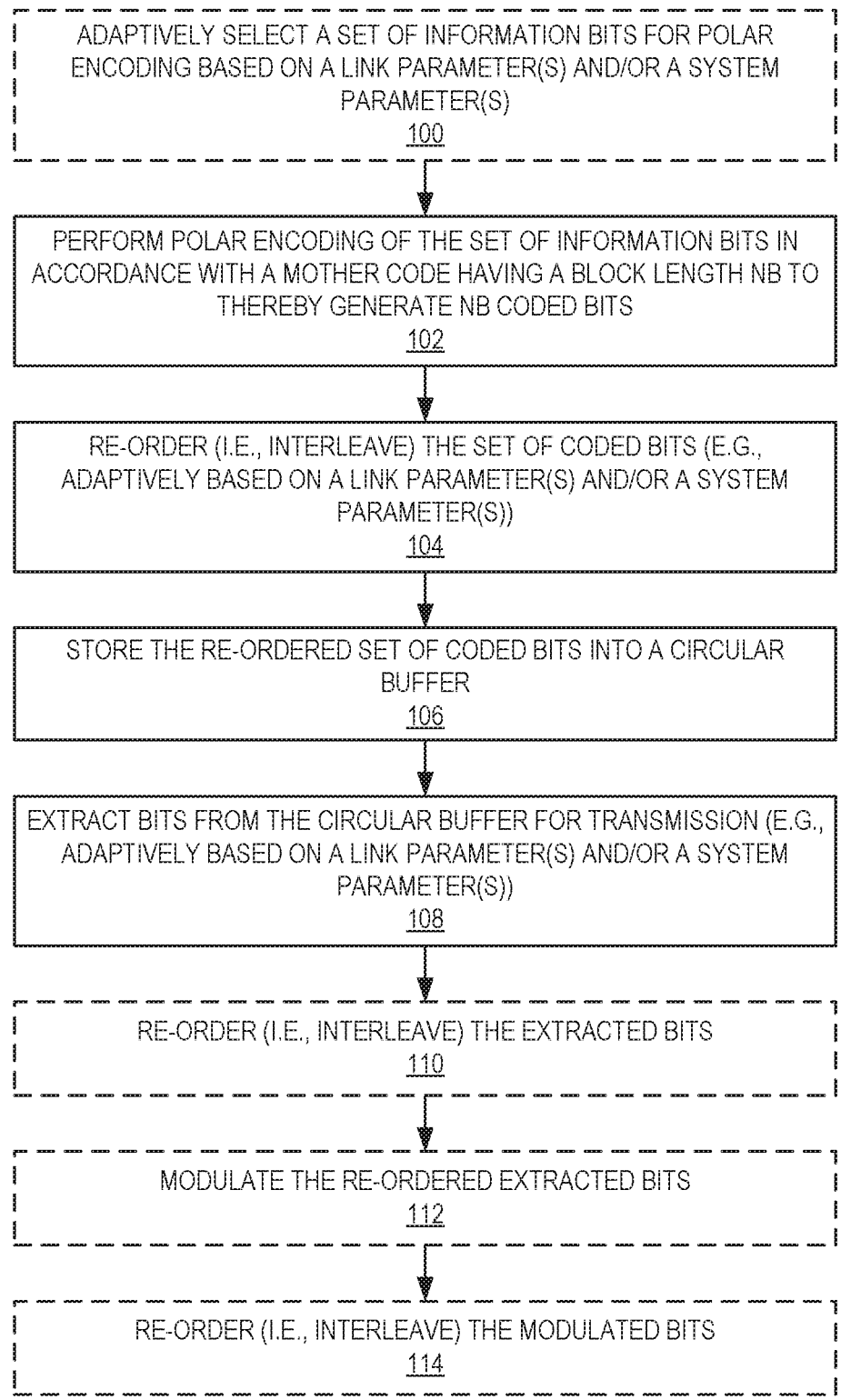
FIG. 9 is a flow chart that illustrates one example of a process that provides rate-matching for polar codes in accordance with some embodiments of the present disclosure, according to various embodiments.

FIG. 9 is a flow chart that illustrates one example of a process in which rate matching is utilized with polar encoding according to at least some of the embodiments disclosed herein. This process is performing by a transmitting node (e.g., a radio access node such as a base station in a cellular communications network when transmitting on the downlink or a wireless device when transmitting on the uplink). Optional steps are illustrated with dashed lines. As illustrated, optionally, the transmitting node adaptively selects a set of information bits for polar encoding based on one or more link parameters and/or one or more system parameters as discussed above with respect to the information set selection circuit or function of FIG. 3 (step 100). For example, the set of bits may be selected in accordance with an information bit ranking sequence, as described above. The transmitting node performs polar encoding of the set of information bits in accordance with a mother code having a block length $N_B$ to thereby generate $N_B$ coded bits, as described above (step 102).

The transmitting node (e.g., the interleaver 14) re-orders the coded bits (step 104) and stores the re-ordered coded bits into the circular buffer 16 (step 106). As discussed above, in some embodiments, the coded bits are re-ordered based on one or more link parameters and/or one or more system parameters. For example, in some embodiments, a code-bit ranking sequence is determined based on one or more link parameters and/or one or more system parameters, and the code bits are re-ordered in accordance with the determined code-bit ranking sequence.

The transmitting node (e.g., bit-extractor 18) extracts N bits from the circular buffer for transmission to thereby provide N rate-matched coded bits for transmission (step 108). In some embodiments, the bits for transmission are extracted from the circular buffer 16 adaptively based on one or more link parameters and/or one or more system parameters. For example, in some embodiments, the coded-bits are re-ordered and stored in the circular buffer 16 according to ranking (e.g., reliability), which may be determined based on one or more link parameters and/or one or more system parameters. The coded-bits may then be extracted from the circular buffer 16 in order of decreasing ranking starting with the highest-ranked coded bit. In some embodiments, the bits for transmission are extracted from the circular buffer by sub-sampling the circular buffer, as discussed above.

Optionally, the transmitting node may re-order (e.g., via pre-modulation interleaver 26) the coded bits extracted from the circular buffer 16 for transmission prior to modulation, as described above (step 110). The transmitting node (e.g., the modulator 30) may then modulate the re-ordered coded bits to thereby provided a number of modulated symbols, as described above (step 112). Lastly, the transmitting node may re-order the modulated symbols (e.g., via symbol interleaver 28), as described above (step 114).

Figure 10:
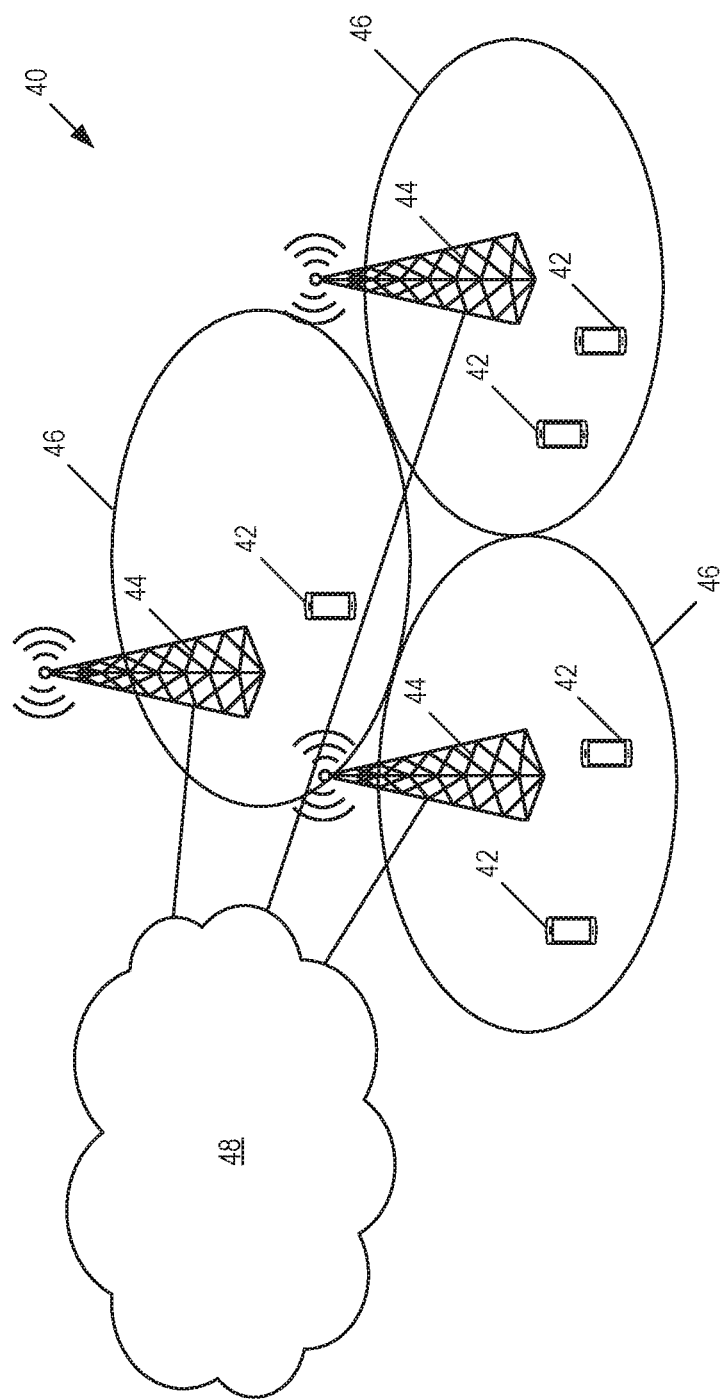
FIG. 10 illustrates one example of a wireless system in which embodiments of the present disclosure may be implemented, according to various embodiments.

FIG. 10 illustrates one example of a wireless system 40 (e.g., a cellular communications network such as, for example, a 3GPP 5G or NR network) in which embodiments of the present disclosure may be implemented. As illustrated, a number of wireless devices 42 (e.g., UEs) wirelessly transmit signals to and receive signals from radio access nodes 44 (e.g., gNBs), each serving one or more cells 46. The radio access nodes 44 are connected to a core network 48. The core network 48 includes one or more core network nodes (e.g., MMEs, Serving Gateways (S-GWs), and/or the like).

Note that the system 10 of either the embodiment of FIG. 3 or the embodiment of FIG. 8 as well as the process of FIG. 9 may be implemented in any radio node within the wireless system 40 such, for example, the wireless devices 42 and/or the radio access nodes 44.

Figure 11:
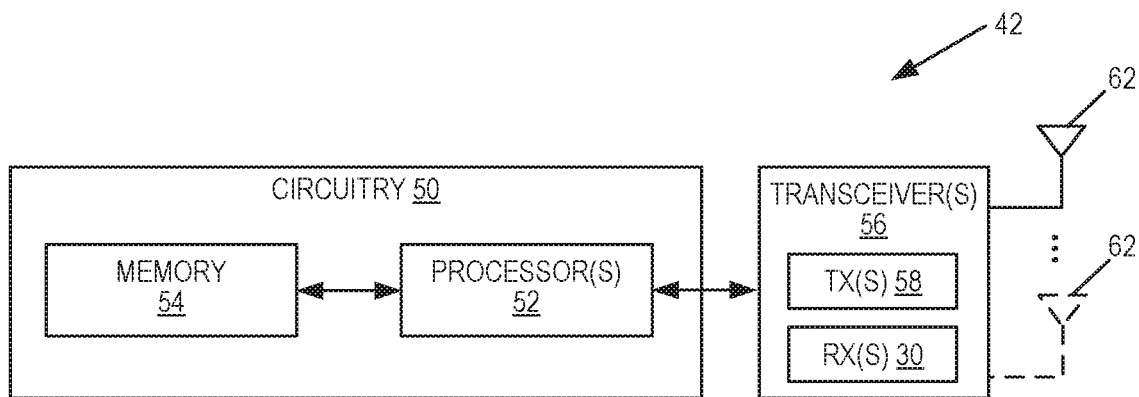
FIGS. 11 and 12 illustrate example embodiments of a wireless device in which embodiments of the present disclosure may be implemented, according to various embodiments.

FIG. 11 is a schematic block diagram of the wireless device 42 (e.g., UE) according to some embodiments of the present disclosure. As illustrated, the wireless device 42 includes processing circuitry 50 comprising one or more processors 52 (e.g., Central Processing Units (CPUs), Application Specific Integrated Circuits (ASICs), Field Programmable Gate Arrays (FPGAs), Digital Signal Processors (DSPs), and/or the like) and memory 54. The wireless device 42 also includes one or more transceivers 56 each including one or more transmitters 58 and one or more receivers 60 coupled to one or more antennas 62. In some embodiments, the functionality of the wireless device 42 described above may be implemented in hardware (e.g., via hardware within the circuitry 50 and/or within the processor(s) 52) or be implemented in a combination of hardware and software (e.g., fully or partially implemented in software that is, e.g., stored in the memory 54 and executed by the processor(s) 52).

In some embodiments, a computer program including instructions which, when executed by the at least one processor 52, causes the at least one processor 52 to carry out at least some of the functionality of the wireless device 52 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as memory).

Figure 12:
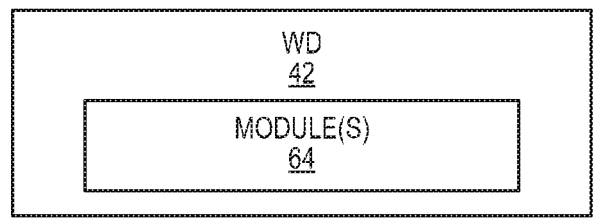

FIG. 12 is a schematic block diagram of the wireless device 42 (e.g., UE) according to some other embodiments of the present disclosure. The wireless device 42 includes one or more modules 64, each of which is implemented in software. The module(s) 64 provide the functionality of the wireless device 12 described herein. For example, the modules 64 may include a performing module operable to perform the function of step 102 of FIG. 9, a first interleaving module operable to perform the function of step 104 of FIG. 9, a storing module operable to perform the function of step 106 of FIG. 9, and an extracting module operable to perform the function of step 108 of FIG. 9.

Figure 13:
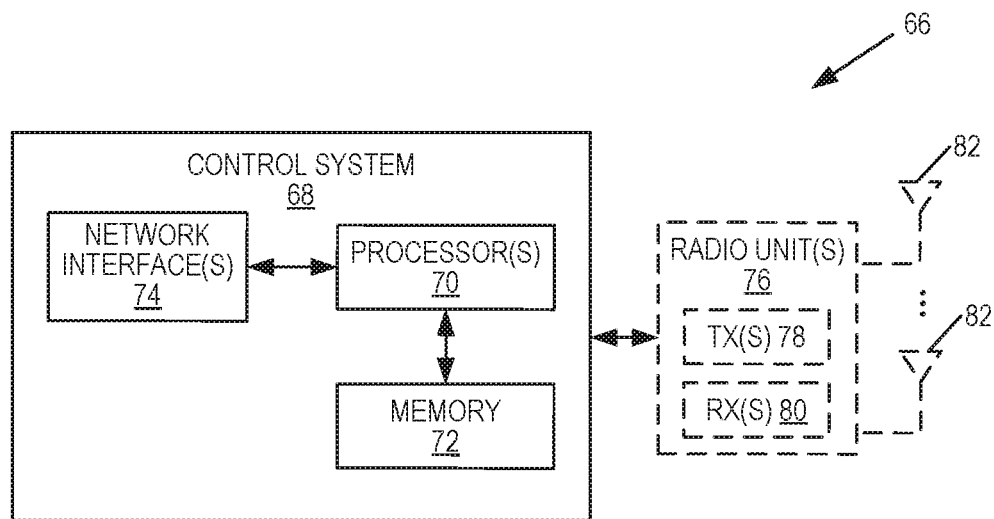

FIG. 13 is a schematic block diagram of a network node 66 (e.g., a radio access node 34 such as, for example, a gNB or a network node such as a core network node) according to some embodiments of the present disclosure. As illustrated, the network node 66 includes a control system 68 that includes circuitry comprising one or more processors 40 (e.g., CPUs, ASICs, DSPs, FPGAs, and/or the like) and memory 72. The control system 68 also includes a network interface 74. In embodiments in which the network node 66 is a radio access node 44, the network node 66 also includes one or more radio units 76 that each include one or more transmitters 78 and one or more receivers 80 coupled to one or more antennas 82. In some embodiments, the functionality of the network node 66 (e.g., the functionality of the radio access node 44) described above may be fully or partially implemented in software that is, e.g., stored in the memory 72 and executed by the processor(s) 70.

FIG. 14 is a schematic block diagram that illustrates a virtualized embodiment of the network node 66 (e.g., the radio access node 34) according to some embodiments of the present disclosure. As used herein, a "virtualized" network node 66 is a network node 66 in which at least a portion of the functionality of the network node 66 is implemented as a virtual component (e.g., via a virtual machine(s) executing on a physical processing node(s) in a network(s)). As illustrated, the network node 66 optionally includes the control system 68, as described with respect to FIG. 13. In addition, if the network node 66 is the radio access node 44, the network node 66 also includes the one or more radio units 76, as described with respect to FIG. 13. The control system 38 (if present) is connected to one or more processing nodes 84 coupled to or included as part of a network(s) 86 via the network interface 74. Alternatively, if the control system 68 is not present, the one or more radio units 76 (if present) are connected to the one or more processing nodes 84 via a network interface(s). Alternatively, all of the functionality of the network node 66 described herein may be implemented in the processing nodes 84 (i.e., the network node 66 does not include the control system 68 or the radio unit(s) 76). Each processing node 84 includes one or more processors 88 (e.g., CPUs, ASICs, DSPs, FPGAs, and/or the like), memory 90, and a network interface 92.

In this example, functions 94 of the network node 66 described herein are implemented at the one or more processing nodes 84 or distributed across the control system 68 (if present) and the one or more processing nodes 84 in any desired manner. In some particular embodiments, some or all of the functions 94 of the network node 66 described herein are implemented as virtual components executed by one or more virtual machines implemented in a virtual environment(s) hosted by the processing node(s) 84. As will be appreciated by one of ordinary skill in the art, additional signaling or communication between the processing node(s) 84 and the control system 68 (if present) or alternatively the radio unit(s) 76 (if present) is used in order to carry out at least some of the desired functions. Notably, in some embodiments, the control system 68 may not be included, in which case the radio unit(s) 76 (if present) communicates directly with the processing node(s) 84 via an appropriate network interface(s).

In some particular embodiments, higher layer functionality (e.g., layer 3 and up and possibly some of layer 2 of the protocol stack) of the network node 66 may be implemented at the processing node(s) 84 as virtual components (i.e., implemented "in the cloud") whereas lower layer functionality (e.g., layer 1 and possibly some of layer 2 of the protocol stack) may be implemented in the radio unit(s) 76 and possibly the control system 68.

In some embodiments, a computer program including instructions which, when executed by the at least one processor 70, 88, causes the at least one processor 70, 88 to carry out the functionality of the network node 66 or a processing node 84 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as the memory 90).

Figure 15:
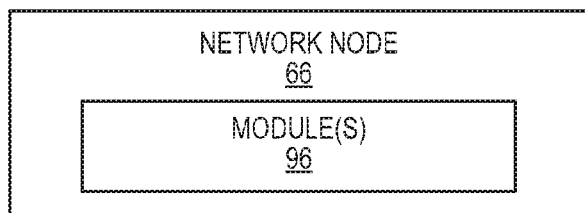

FIG. 15 is a schematic block diagram of the network node 66 (e.g., the radio access node 44) according to some other embodiments of the present disclosure. The network node 66 includes one or more modules 96, each of which is implemented in software. The module(s) 96 provide the functionality of the network node 66 described herein. For example, the modules 96 may include a performing module operable to perform the function of step 102 of FIG. 9, a first interleaving module operable to perform the function of step 104 of FIG. 9, a storing module operable to perform the function of step 106 of FIG. 9, and an extracting module operable to perform the function of step 108 of FIG. 9.

One key part of the present disclosure is that the interleaver that specifies how the polar encoded bits are written into the circular buffer and the bit-extractor that specifies how bits are extracted from the circular buffers are dependent on link parameters, such as code block length, coding rate, and (Quadrature Amplitude Modulation (QAM)) modulation order, and/or system parameters, such as the transmission methods (Orthogonal Frequency Division Multiplexing (OFDM) vs. Discrete Fourier Transform Spread OFDM (DFT-S-OFDM)), radio resource allocation, and receiver capability. According to a preferred embodiment, based on these various parameters, a sequence that ranks the reliability of the polar coded bits is constructed, based on which the interleaver determines the ordering with which the polar coded bits are written into the circular buffers. This code-bit ranking sequence which in turn determines an information-bit ranking sequence which is used to determine the information set of the polar encoder. Both of these sequences can be predetermined and stored in memory for different values of the aforementioned parameters.

One advantage of the proposed method is that it can optimize the code performance for different scenarios since the puncturing, repetition, and information set selection for polar codes are often dependent on various link and system parameters. Another key advantage of the proposed method is that it is simple to implement and is flexible enough for future evolution of polar coding. The proposed scheme can also be viewed as an extension and generalization to the existing rate-matching scheme used by Long Term Evolution (LTE).

A core essence of certain embodiments of the solution is a rate matching mechanism that is dependent on several link parameters (such as code block length, coding rate, and (QAM) modulation order) and or system parameters (such as OFDM vs. DFT-S-OFDM), radio resource allocation, and receiver capability).

Those skilled in the art will recognize improvements and modifications to the embodiments of the present disclosure. All such improvements and modifications are considered within the scope of the concepts disclosed herein.

REFERENCE LIST

[1] E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009.

[2] I. Tal and A. Vardy, "List Decoding of polar codes," in Proceedings of IEEE Symp. Inf. Theory, pp. 1-5, 2011.

[3] Leroux, et. al., "A Semi-Parallel Successive-Cancellation Decoder for Polar Codes," IEEE TRANSACTIONS ON SIGNAL PROCESSING, VOL. 61, NO. 2, Jan. 15, 2013.

The following acronyms are used throughout this disclosure.

| | |
|---|---|
| 3GPP | Third Generation Partnership Project |
| 5G | Fifth Generation |
| ASIC | Application Specific Integrated Circuit |
| CPU | Central Processing Unit |
| CRC | Cyclic Redundancy Check |
| DCI | Downlink Control Information |
| DFT-S-OFDM | Discrete Fourier Transform Spread Orthogonal Frequency Division Multiplexing |
| DSP | Digital Signal Processor |
| eNB | Enhanced or Evolved Node B |
| FPGA | Field Programmable Gate Array |
| gNB | New Radio Base Station |
| HARQ | Hybrid Automatic Repeat Request |
| IR-HARQ | Incremental Redundancy Hybrid Automatic Repeat Request |
| LDPC | Low-Density Parity-Check |
| LLR | Log-Likelihood Ratio |
| LTE | Long Term Evolution |
| ML | Maximum-Likelihood |
| MME | Mobility Management Entity |
| MTC | Machine Type Communication |
| PBCH | Physical Broadcasting Channel |
| P-GW | Packet Data Network Gateway |
| NR | New Radio |
| OFDM | Orthogonal Frequency Division Multiplexing |
| PDCCH | Physical Downlink Control Channel |
| PDSCH | Physical Downlink Shared Channel |
| PSCCH | Physical Sidelink Control Channel |
| PUCCH | Physical Uplink Control Channel |
| PUSCH | Physical Uplink Shared Channel |
| QAM | Quadrature Amplitude Modulation |
| SC | Successive Cancellation |
| SCEF | Service Capability Exposure Function |
| SCL | List decoding of Successive Cancellation |
| S-GW | Serving Gateway |
| SIB | System Information Block |
| SNR | Subscribe-Notifications-Request |
| UCI | Uplink Control Information |
| UE | User Equipment |

What is claimed is:

1. A method of operation of a transmitting node in a wireless system, comprising:
performing polar encoding of a set of K information bits in accordance with a polar sequence of length $N_B$ to thereby generate $N_B$ coded bits;
interleaving the coded bits to thereby provide an interleaved coded bit sequence, wherein interleaving the coded bits comprises adaptively interleaving the coded bits based on one or more link parameters and/or one or more system parameters such that the coded bits are ordered in the interleaved coded bit sequence according to a ranking;
storing the interleaved coded bit sequence into a circular buffer of length $N_B$, wherein the coded bits are stored in an order of decreasing ranking in the circular buffer; and
extracting N coded bits for transmission from the circular buffer consecutively in an order of decreasing ranking.

2. The method of claim 1, wherein $N >= N_B$, and $(N-N_B)$ coded bits are repeated.

3. The method of claim 1, wherein $N <= N_B$, and no coded bits are repeated.

4. The method of claim 1, wherein extracting the N coded bits from the circular buffer comprises adaptively extracting the N coded bits from the circular buffer consecutively according to a sequence of the coded bits, where the sequence specifies the order the coded bits are written into the circular buffer.

5. The method of claim 1, wherein extracting the N coded bits from the circular buffer comprises adaptively extracting the N coded bits from the circular buffer based on one or more link parameters and/or one or more system parameters.

6. The method of claim 5, wherein extracting the N coded bits from the circular buffer comprises adaptively extracting the N coded bits from the circular buffer based on a code rate K/N.

7. The method of claim 6, wherein extracting the N coded bits from the circular buffer comprises adaptively extracting the N coded bits from the circular buffer based on the code length N and a mother code of length $N_B$.

8. The method of claim 1, further comprising, prior to performing polar encoding of the set of information bits, adaptively selecting the information bit location based on one or more link parameters and/or one or more system parameters.

9. The method of claim 8, wherein the step of adaptively selecting the information bit location comprises adaptively selecting based on a code rate K/N.

10. The method of claim 8, wherein the step of adaptively selecting the information bit location comprises adaptively selecting based on the code length N and a mother code of length $N_B$.

11. The method of claim 1, wherein the one or more link parameters comprise a number of information bits K to be transmitted, a code length N to be used for transmission, and a code rate R=K/N to be used for transmission.

12. The method of claim 1, wherein the one or more system parameters comprise a parameter that indicates whether the transmission is an uplink transmission or downlink transmission, a parameter related to radio resource allocation, a parameter related to waveform to be used for the transmission, a parameter related to redundancy versions, and/or a parameter related to receiver capability.

13. The method of claim 1, further comprising:
interleaving the N coded bits extracted from the circular buffer to provided N interleaved coded bits; and
modulating the N interleaved coded bits to provide a plurality of symbols.

14. The method of claim 13, further comprising interleaving the plurality of symbols.

15. A transmitting node comprising:
at least one transmitter; and
processing circuitry adapted to cause the transmitting node to:
perform polar encoding of a set of K information bits in accordance with a polar sequence of length $N_B$ to thereby generate $N_B$ coded bits;
interleave the coded bits to thereby provide an interleaved coded bit sequence, wherein interleaving the coded bits comprises adaptively interleaving the coded bits based on one or more link parameters and/or one or more system parameters such that the coded bits are ordered in the interleaved coded bit sequence according to a ranking;
store the interleaved coded bit sequence into a circular buffer of length $N_B$, wherein the coded bits are stored in an order of decreasing ranking in the circular buffer; and
extract N coded bits for transmission from the circular buffer consecutively in an order of decreasing ranking.

16. The transmitting node of claim 15, wherein the transmitting node is a User Equipment (UE).

17. The transmitting node of claim 15, wherein the transmitting node is a network node.

* * * * *